(12) United States Patent
Lee et al.

(10) Patent No.: US 8,633,108 B1
(45) Date of Patent: Jan. 21, 2014

(54) DUAL DAMASCENE PROCESS

(71) Applicant: Taiwan Semiconductor Manufacturing Co., Ltd., Hsin-Chu (TW)

(72) Inventors: Chia-Ying Lee, New Taipei (TW); Jyu-Horng Shieh, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/665,165

(22) Filed: Oct. 31, 2012

(51) Int. Cl.
*H01L 21/31* (2006.01)

(52) U.S. Cl.
USPC .................................. 438/672; 257/E23.063

(58) Field of Classification Search
USPC ................. 438/629, 637, 639, 640, 672, 675; 257/774, E23.067
See application file for complete search history.

(56) References Cited

U.S. PATENT DOCUMENTS

| 2011/0027962 A1* | 2/2011 | Bernstein et al. ............. 438/386 |
| 2011/0076845 A1 | 3/2011 | Tsai et al. |
| 2011/0260323 A1* | 10/2011 | Yang et al. .................... 257/751 |

* cited by examiner

*Primary Examiner* — Brook Kebede
(74) *Attorney, Agent, or Firm* — Duane Morris LLP

(57) ABSTRACT

A method for forming dual damascene structures in a semiconductor structure is disclosed. The method generally includes etching a substrate using a first hard mask to form a plurality of first trenches and vias, forming a set of first conductive lines and via interconnects, removing the first hard mask, etching the substrate using a second hard mask to form a plurality of second trenches and vias, and forming a set of second conductive lines and via interconnects. At least some of the first conductive lines are interspersed between some of the second conductive lines. A planarization process is used on the substrate after forming the first conductive lines and via interconnects before forming the second conductive lines and via interconnects.

20 Claims, 5 Drawing Sheets

DUAL DAMASCENE PROCESS

FIELD OF THE DISCLOSURE

The present disclosure generally relates to semiconductors, and more particularly to processes for fabricating semiconductor integrated circuits (IC) or chips.

BACKGROUND

Modern semiconductor packages are formed from multiple stacked material layers that may include numerous active devices electrically coupled together by conductive metal interconnects and lines. High speed semiconductor devices can be formed using a combination of copper interconnects with suitable dielectric materials or films such as low-k dielectrics to take advantage of the superior conductivity of copper and reduced parasitic capacitance between the conductors.

Back end-of-line ("BEOL") fabrication processes are used to create an intricate network of conductive interconnects in each layer and between the multiple layers. An additive patterning process referred to as "dual damascene" is one BEOL process used to form patterned copper conductor circuits in chip packages which interconnect various active components (e.g., resistors, transistors, etc.) disposed in single and multiple layers throughout the chip. Some of these interconnect circuit structures include within-layer trenches or lines filled with the copper to form circuits within a layer and between-layer vias which are essentially metal-plated or filled holes that electrically connect circuits between devices in the multiple layers of the semiconductor package.

As semiconductor technology pushes to 14 nanometer (N14) and below scale, the via resistance (Rc) yield window suffers caused by worsening via CDU (critical dimension uniformity) and OVL (overlay) inducing via under etch.

BRIEF DESCRIPTION OF THE DRAWINGS

The features of the preferred embodiments will be described with reference to the following drawings where like elements are labeled similarly, and in which.

Figure 1:
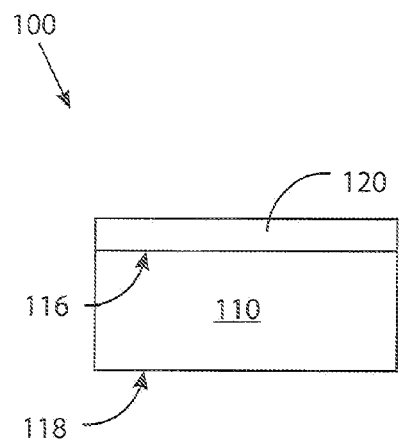
FIGS. 1-16 show sequential cross-sectional side elevation views of a semiconductor structure during an exemplary dual damascene fabrication process according to the present disclosure.

All drawings are schematic and are not drawn to scale.

DETAILED DESCRIPTION

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that can exist alone or in other combinations of features; the scope of the disclosure being defined by the claims appended hereto. The terms "chip" and "die" are used interchangeably where mentioned herein.

An exemplary double photolithography and etch dual damascene process is disclosed that includes an improved double patterning sequence of process steps suitable for producing conductive lines and vias below the 20 nanometer (N20) semiconductor technology node, and more particularly is adapted for N14 and below. As further described herein, the present dual damascene process includes completing a first set of conductive lines fully before fully forming a second set of conductive lines. This approach advantageously produces larger via to metal landing areas for slot via and self-aligned via processes. Slot via overlay specification windows and via local uniformity requirements are also beneficially relaxed making the process more reliable and predictable for forming good quality vias which are fully formed and have suitably dimensioned via landing areas.

An exemplary method for forming a semiconductor structure using a dual damascene-double patterning process according to the present disclosure is illustrated in FIGS. 1-16, which shows sequential cross-sectional side views through a semiconductor during the fabrication process.

Referring to FIG. 1, a method for forming a semiconductor structure 100 includes first providing a substrate 110 on which a first in-situ hard mask 120 is first deposited and formed. In various embodiments, substrate 110 may be an IMD (inter metal dielectric) layer such as without limitation SiO (silicon monoxide), PSG (phosphosilicate glass), USG (undoped silica glass), low K (LK), ELK (extreme LK), and ULK (ultra LK). The substrate 110 may be formed by CVD (chemical vapor deposition), PECVD (plasma enchanced CVD), or other suitable methods. Hard mask 120 may be formed on substrate 110 by PVD (physical vapor deposition) such as sputtering, CVD, or ALD (atomic layer deposition) methods.

Hard mask 120 is a layer comprised of any suitable material capable of protecting covered or underlying portions of substrate 110 from dissolving during etching, such as without limitation Ti (titanium), TiN (titanium nitride), Ta (tantium), and TaN (tantium nitride). Other suitable non-metal containing hard mask materials that may be used can include silicon nitride, silicon oxynitride, and silicon carbide. Selection of suitable materials for hard mask 120 and/or dielectric layer 110 is based at least in part on the etch selectivity between the substrate and hard mask to pattern the substrate for forming trenches for conductive lines and vias for conductive interlayer interconnects.

Figure 2:
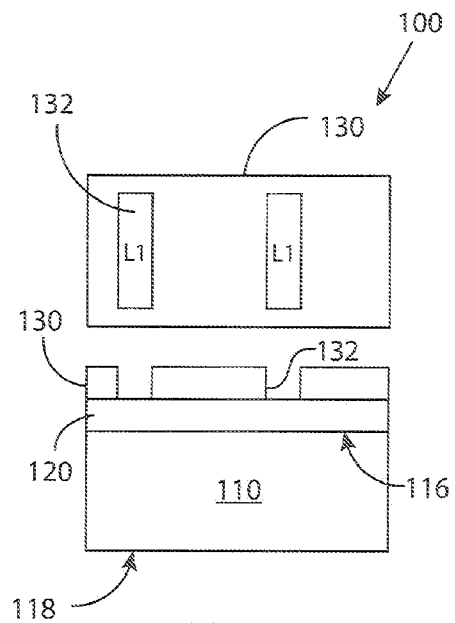

Referring to FIG. 2, a first patterned photoresist layer 130 including a first trench pattern 132 is next formed on semiconductor structure 100 using a first photolithography process for patterning the hard mask 120. In some embodiments, photoresist layer 130 is formed directly on hard mask 120. In the patterning process, a photoresist material is first deposited on substrate hard mask 120 to form a uniform solid layer or film by any suitable method including spin coating. The photoresist material may be any material suitable for photolithography in a semiconductor fabrication processes such as for example without limitation photoresist on ARC (anti-reflective coating), photoresist on Si-ARC/SOC (spin on carbon), and others.

Photoresist layer 130 is next patterned using a reticle or photomask (not shown) having a pattern configured to produce the first trench pattern 132 in photoresist layer 130 comprising a plurality of generally rectilinear shaped openings, as shown in FIG. 2. Trench pattern 132 will be used to form a first set of L1 trench openings 122 in hard mask 120 (see FIG. 3). The L1 trench openings 122 serve as a template to later form a first set of L1 trenches 112 in substrate 110 (see FIG. 6). Accordingly, L1 trench openings 122 are configured and dimensioned to correspond to and define the first set of L1 trenches 112. Any suitable number, configuration, and arrangement of L1 trench openings 122 may be formed in hard mask 120 to correspond to the desired configuration of the circuit to be formed in substrate 110.

The first trench pattern 132 is transferred to photoresist layer 130 in FIG. 2 using photolithography methods including light exposure and development of the photoresist layer. In some embodiments, photoresist layer 130 is initially exposed to intense light (e.g. UV or ultraviolet) of suitable wavelength through the photomask to create exposed areas of the photoresist layer corresponding to the first trench pattern 132. The photoresist layer 130 is subsequently developed to form trench pattern 132, which in various embodiments can include using a developer solution which selectively removes light-exposed areas of the photoresist layer and/or other suitable techniques. A post-exposure bake (PEB) of photoresist layer 130 may be performed in various embodiments before developing to help reduce standing wave phenomena caused by the destructive and constructive interference patterns of incident light on the photoresist layer during the exposure step. In some embodiments, it should be noted that photoresist layer 130 may be pre-baked prior to light exposure to remove excess photoresist solvent.

It will be appreciated that in various other embodiments, a patterned photoresist layer 130 may be produced by other methods including for example without limitation electron or ion beam writing or mask-less photolithography.

FIG. 2 includes a top plan view of patterned photoresist layer 130 above the cross-sectional view through semiconductor structure 100 for comparison.

Figure 3:
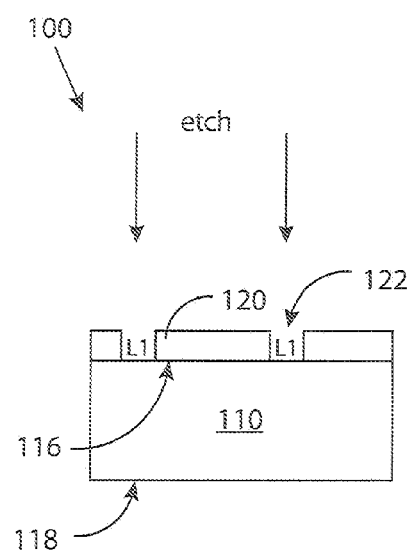

Referring now to FIG. 3, the method for forming semiconductor structure 100 continues with performing a first etching process to etch hard mask 120. Using the previously patterned photoresist layer 130 shown in FIG. 2, this first L1 hard mask etching process transfers trench pattern 132 in photoresist layer 130 to hard mask 120 to form the first set of L1 trench openings 122 in the hard mask. In some embodiments, the etching process is controlled to terminate etching of the hard mask 120 at the interface between the hard mask and substrate 110 so that the trench openings 122 terminate at the top surface 116 of substrate 110, as shown. In various embodiments, this may be accomplished by selection of etching gas chemistries, materials with different etch selectivity, etching process depth control utilizing the etching equipment, or a combination thereof. In some embodiments, gaseous dry etching is used to etch hard mask 120. Suitable etching gases that may be used include without limitation HBr, Cl2, CH4, CHF3, CH2F2, CF4, Ar, H2, N2, O2, and others.

After hard mask 120 is patterned, photoresist layer 130 is stripped and removed by any suitable method used in the art including wet/liquid stripping or dry gaseous ashing (e.g. O2 ashing, etc.) depending on the type of photoresist material used. The intermediate semiconductor structure shown in FIG. 3 is produced with patterned hard mask 120 including first set of L1 trench openings 122.

Figure 4:
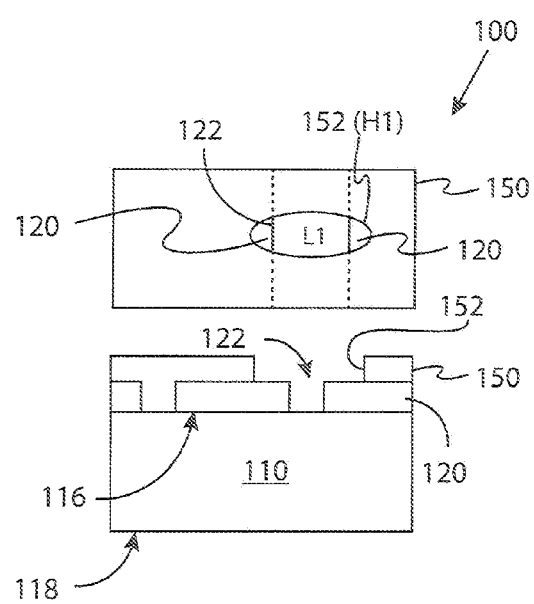

Referring now to FIG. 4, the method for forming semiconductor structure 100 continues by next forming a second patterned photoresist layer 150 on semiconductor structure 100 using a second photolithography process. In some embodiments, photoresist layer 150 is formed directly on hard mask 120. Photoresist layer 150 includes a plurality of first H1 via holes 152 which are aligned with and at least partially intersect the first set of L1 trench openings 122 in hard mask 120. In some embodiments, patterned photoresist layer 150 may be formed in a similar manner to patterned photoresist layer 130 as previously described herein.

FIG. 4 includes a top plan view of patterned photoresist layer 150 above the cross-sectional view through semiconductor structure 100 for comparison.

Photoresist layer 150 is patterned using a second reticle or photomask (not shown) having a pattern configured to produce first H1 via holes 152, shown in FIG. 4. Via holes 152 will serve as a template to later form open H1 vias 114 in substrate 110 (see FIG. 6). Accordingly, via holes 152 are configured, dimensioned, and arranged to correspond to and define the first H1 vias 114. Any suitable number, configuration, and arrangement of H1 via holes 152 may be formed in photoresist layer 150 to correspond to the desired layout of H1 vias 112 to be formed in substrate 110 for interconnecting the L1 trenches 112 to circuits in a metal layer below semiconductor structure 100 (not shown).

With continuing reference to FIG. 4, the H1 via holes 152 have a laterally elongated configuration in some embodiments as shown according to the present disclosure. In some embodiments, via holes 152 can have a generally oval or ellipsoidal shape including a major axis defining a transverse diameter D1 and a minor axis oriented perpendicular to the major axis and defining a conjugate diameter D2 that is less than the transverse diameter (see FIG. 17). Each via hole 152 is arranged to overlap above and intersect an L1 trench opening 122 in hard mask 120 previously formed. In some embodiments, referring to FIGS. 4 and 17, a via hole 152 is shown in an arrangement oriented so that the major axis (defined by transverse diameter D1) is aligned transverse to and extending in a direction lying across the lateral width W of an L1 trench opening 122, and the minor axis (defined by conjugate axis D2) is ideally aligned axially parallel to and extending along the length LG of the trench opening.

Figure 17:
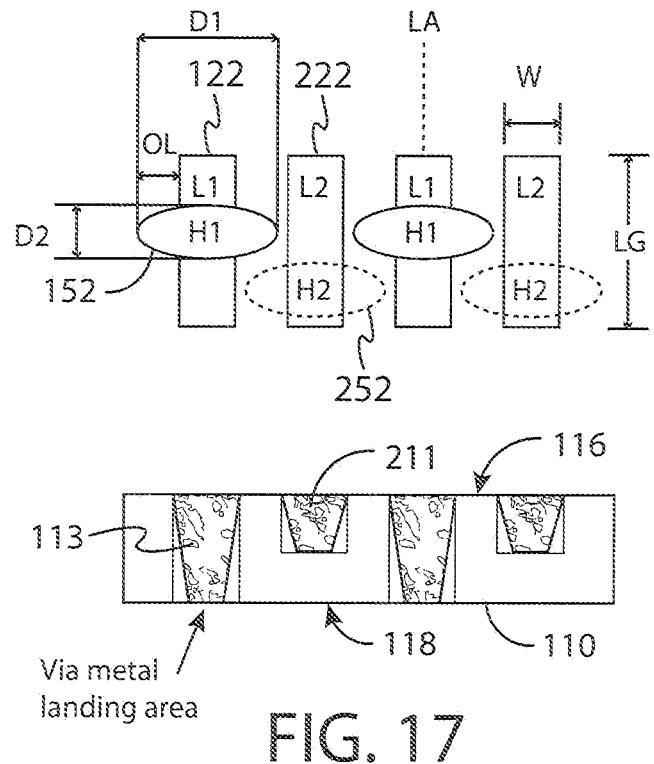
FIG. 17 is a schematic diagram showing a top plan view of an exemplary arrangement of trench etching holes formed in a hard mask(s) and via etching holes formed in a photoresist layer(s) overlying the trench etching holes, with an exemplary cross-section of a semiconductor structure having conductive lines and via interconnects shown immediately below.

As shown in the plan view of photoresist layer 150 included in FIG. 4, at least one or both end portions of each H1 via hole disposed along the transverse axis D1 therefore extends transversely beyond the lateral sides of each trench opening 122 by an overlap distance OL as shown in FIG. 17. In some embodiments, therefore, the transverse diameter D1 of elongated via holes 152 is larger than the lateral width W of trench opening 122 to compensate for possible photomask misalignment and shift during the second photolithography process when via holes 152 are formed in photoresist layer 150. In some exemplary embodiments, for example, width W of trench opening 122 may be about 10 nm to 100 nm. Advantageously, as further explained herein, this effectively still produces a via 114 meeting critical dimension uniformity (CDU) specifications and having a suitable metal landing area (see, e.g. FIGS. 17 and 18) at the bottom of the via where the via interfaces with a metal line or pad in a circuit formed in the adjoining metal layer immediately below semiconductor structure 100 shown in the figures.

In other embodiments, via holes 152 may have other elongated shapes including various rectilinear shapes such as rectangular or a circular shape so long as the width (i.e. largest dimension) or diameter is larger than width W of the L1 trench openings 122 for reason which will become apparent as further described herein.

Figure 5:
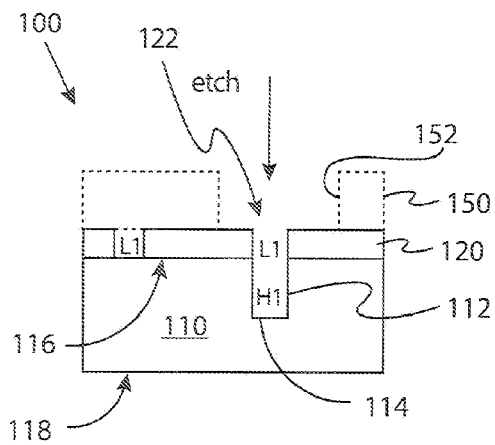

Referring now to FIG. 5, the method for forming semiconductor structure 100 continues by next partially forming the H1 via 114 in substrate 110 using patterned photoresist layer 150 with via holes 152 formed therein and hard mask 120. In some embodiments, a second etching process such as a gaseous dry etching process is used choosing an etching gas chemistry that selectively dissolves substrate 110 without substantially dissolving hard mask 120 and photoresist layer 150. Suitable exemplary etching gases that may be used include without limitation CF4, CHF3, CH2F2, CH3F, CH4, Ar, O2, H2, and N2. Partial etching of via 114 is performed so that the bottom of via terminates between the top and bottom surfaces 116, 118 of substrate 110 as shown in FIG. 5.

Anisotropic dry plasma gas etching may be used for any of the etching steps described herein to produce more substantially uniform and straight vertical walls for the via and trench profiles to be formed in the hard masks and substrate used in the semiconductor structure fabrication process according to the present disclosure.

It will be appreciated that vias 114 produced according to the present disclosure will have a generally rectilinear box or slot shape (i.e. square or rectangular) in lateral cross section due to the shape of via holes 152 in photoresist layer 150 in relation to the rectilinear shaped trench openings 122 in hard mask 120 (best shown in FIG. 4).

After the partial H1 vias 114 are formed in substrate 110, photoresist layer 150 is removed by any suitable wet or dry stripping process leaving the substrate structure shown in FIG. 5 with hard mask 120 and L1 trench openings 122 still intact.

Figure 6:
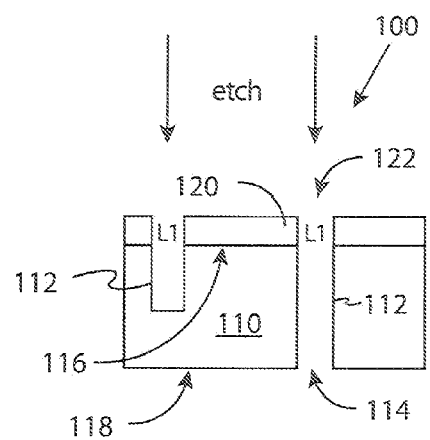

The method for forming semiconductor structure 100 continues by next fully forming the L1 trenches 112 and H1 vias 114 in substrate 110. Referring to FIG. 6, a third etching process such as a dual damascene gaseous etching process is used to form trenches 112 and vias 114. In some embodiments, the same gas chemistry used to partially form via 114 (see FIG. 5) may be used. Accordingly, suitable exemplary etching gases include without limitation CF4, CHF3, CH2F2, CH3F, CH4, Ar, O2, H2, and N2. It is desirable that the etching gas chemistry used selectively dissolves substrate 110 without substantially etching the hard mask 120. The etching process is performed until the L1 trenches 112 and associated H1 vias 114 are fully formed in substrate 110 as shown in FIG. 6. Via 114 completely penetrates substrate 110 and extends through the top and bottom surfaces 116, 118 of the substrate for forming a conductive interconnect with circuits dispose in the metal layer beneath substrate 110.

Figure 7:
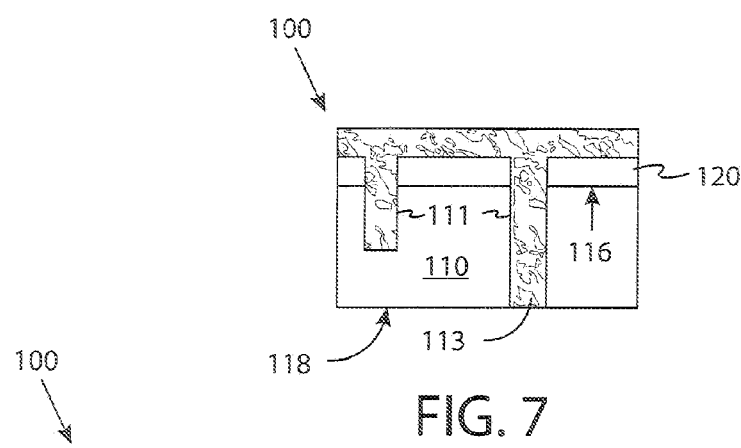

Referring now to FIG. 7, the method for forming semiconductor structure 100 continues with metallization of the heretofore open L1 trenches 112 and associated H1 vias 114 structures in substrate 110. Any suitable conductive material such as without limitation conductive metals may be used for metallization. In some embodiments, copper is used and deposited in these open trench and via structures in the substrate by any suitable technique such as chemical vapor deposition (CVD), physical vapor deposition (PVD), electrochemical plating (ECP), electroless-plating, etc. In some embodiments, ECP is used. An overburden of copper is typically formed on top of substrate 110, producing the structure shown in FIG. 7. The conductive metal in the now filled first trenches 112 and first vias 114 respectively produces first conductive lines 111 forming part of a circuit within substrate 110 and first conductive via interconnects 113 for connecting the circuit within substrate 110 to a circuit formed in a substrate immediately below (not shown).

In some embodiments, it is appreciated that barrier and seed layers may first be deposited in the open trenches 112 and vias 114 as is known in the art to prevent copper diffusion and contamination of the adjacent substrate 110 and to form an adhesion layer for improved bonding of the copper.

Figures 8, 9:
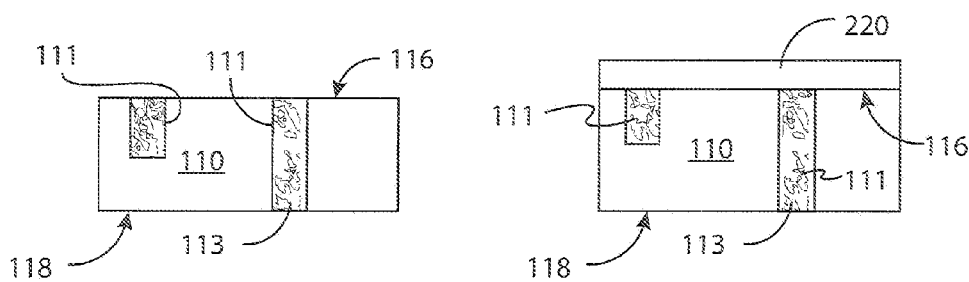

In FIG. 8, the method for forming semiconductor structure 100 continues with removing the first hard mask 120 and overburden of copper thereon. In some embodiments, a first planarization process such as chemical mechanical planarization (CMP) is used to remove the hard mask and overburden. This produces the structure shown in FIG. 8 in which the top surface 116 of substrate 110 is now exposed for further processing, as described herein.

It should be noted that the partially-formed semiconductor structure 100 shown in FIG. 8 includes first conductive lines 111 and first conductive via interconnects 113, which represent only part of the conductive lines and interconnects to be built. Accordingly, in various embodiments according to the present disclosure, the full array of conductive lines and interconnects are built in a staged and staggered manner utilizing two differently patterned hard masks, as well as two metallization and planarization steps as will now be further described.

Referring now to FIG. 9, a second hard mask 220 is formed on substrate 110. Hard mask 220 may be made of the same materials as hard mask 120 already described herein.

Figure 10:
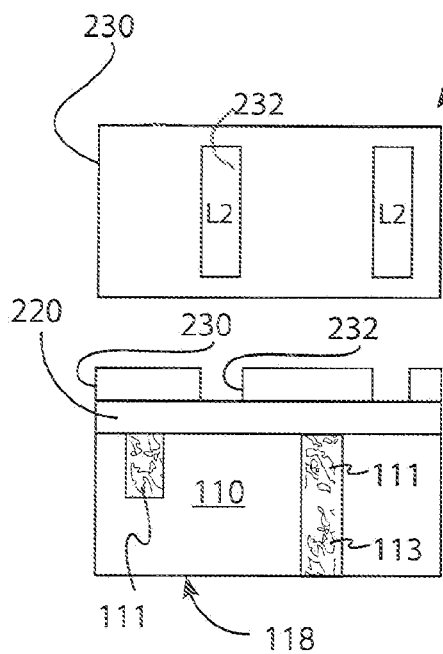

In FIG. 10, a third photoresist layer 230 including a second trench pattern 232 is next formed on semiconductor structure 100 using a third photolithography process for patterning the hard mask 220. In some embodiments, photoresist layer 230 is formed directly on hard mask 220. The photoresist material used for layer 230 may be the same as for photoresist layer 130 already described herein.

Photoresist layer 230 is patterned using a reticle or photomask (not shown) having a pattern configured to produce the second trench pattern 232 in photoresist layer 230 comprising a plurality of generally rectilinear shaped openings, as shown in FIG. 10. Trench pattern 232 will be used to form a second set of L2 trench openings 222 in hard mask 220 (see FIG. 11). The L2 trench openings 222 serve as a template to later form a second set of L2 trenches 212 in substrate 110 (see FIG. 13). Accordingly, L2 trench openings 222 are configured and dimensioned to correspond to and define the first set of L2 trenches 212 (see FIG. 14). Any suitable number, configuration, and arrangement of L2 trench openings 222 may be formed in hard mask 220 to correspond to the desired configuration of the circuit to be formed in substrate 110.

It should be noted that the plurality of first trench openings 122 formed in first patterned hard mask 120 are different than the second trench openings 222 in second patterned hard mask 220, and therefore are located at different positions with respect to the substrate 110 (compare FIG. 3 to FIG. 11). Accordingly, the first and second trenches 112 and 212 respectively to be formed will be located at different positions in substrate 110 with respect to each other.

Figure 11:
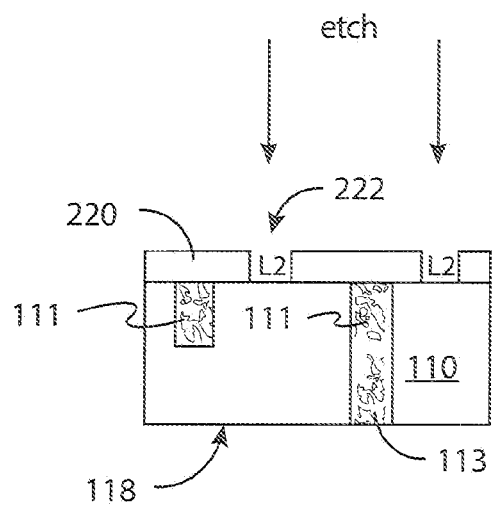

Referring now to FIG. 11 the method for forming semiconductor structure 100 continues with performing a fourth etching process to etch hard mask 220. Using the previously patterned photoresist layer 230 shown in FIG. 2, this L2 hard mask etching process transfers trench pattern 232 in photoresist layer 230 to hard mask 220 to form the second set of L2 trench openings 222 in the hard mask. In some embodiments, the etching process is controlled to terminate etching of the hard mask 220 at the interface between the hard mask and substrate 110 so that the trench openings 222 terminate at the top surface 116 of substrate 110, as shown. In various embodiments, this may be accomplished by selection of etching gas chemistries, materials with different etch selectivity, etching process depth control utilizing the etching equipment, or a combination thereof. In some embodiments, gaseous dry etching is used to etch hard mask 120. Suitable etching gases that may be used include without limitation HBr, Cl2, CH4, CHF3, CH2F2, CHF3, CF4, Ar, H2, N2, O2, and others.

After hard mask 220 is patterned, photoresist layer 230 is stripped and removed by any suitable method used in the art including wet/liquid stripping or dry gaseous ashing (e.g. O2 ashing, etc.) depending on the type of photoresist material used. The intermediate semiconductor structure shown in FIG. 11 is produced with patterned hard mask 220 including second set of L2 trench openings 222.

After hard mask 220 is patterned, it further should be noted in FIG. 11 that the trench openings 222 are arranged so as to be interspersed between the first conductive lines 111 so that there is a portion of hard mask 220 covering and disposed above these conductive lines as protection from further etching during the remaining fabrication process steps.

Figure 12:
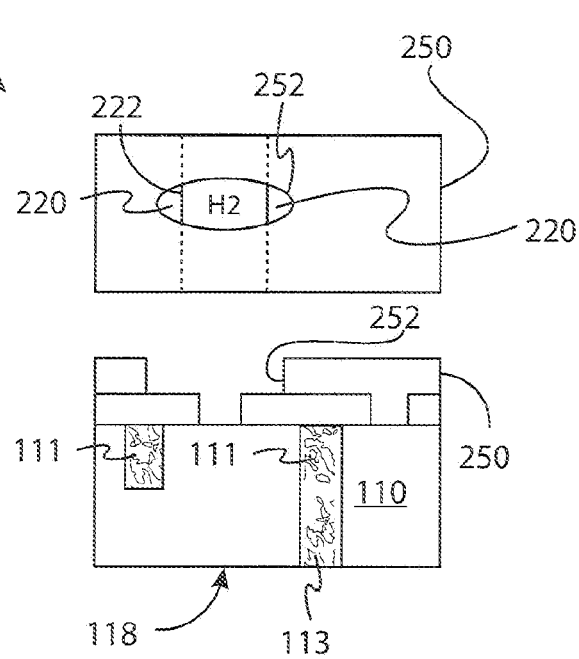

Referring now to FIG. 12, the method for forming semiconductor structure 100 continues by next forming a fourth patterned photoresist layer 250 on semiconductor structure 100 using a fourth photolithography process. In some embodiments, photoresist layer 250 is formed directly on hard mask 220. Photoresist layer 250 includes a plurality of second H2 via holes 252 which are aligned with and at least partially intersect the second set of L2 trench openings 222 in hard mask 220. In some embodiments, patterned photoresist layer 250 may be formed in a similar manner to patterned photoresist layer 130 as previously described herein.

FIG. 12 includes a top plan view of patterned photoresist layer 250 above the cross-sectional view through semiconductor structure 100 for comparison. In some embodiments, the H2 via holes 252 in photoresist layer 250 may have the same configuration and dimensions in relation to the L2 trench openings 222 as the H1 via holes 152 already described herein (see also FIGS. 4 and 17). In other embodiments, via holes 252 may be different.

Figure 13:
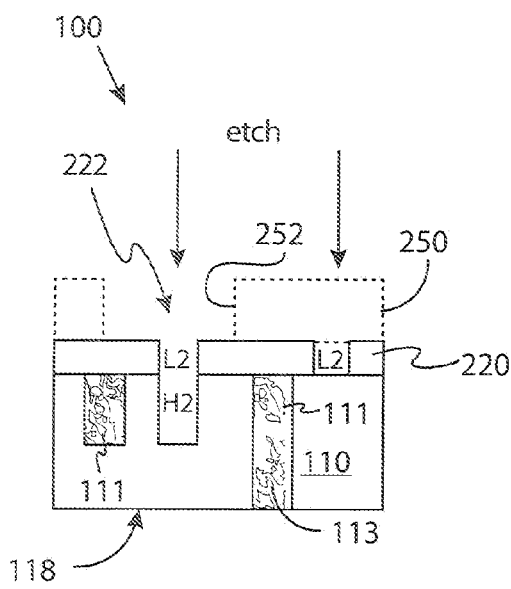

Referring now to FIG. 13, the method for forming semiconductor structure 100 continues by next partially forming the open H2 via 214 in substrate 110 using patterned photoresist layer 250 and via holes 252 formed therein. In some embodiments, a fifth etching process such as a gaseous dry etching process is used choosing an etching gas chemistry that selectively dissolves substrate 110 without substantially dissolving hard mask 220 and photoresist layer 250. An etching gas similar to that used in FIG. 5 to partially form via 114 may be used. Suitable exemplary etching gases that may be used include without limitation CF4, CHF3, CH2F2, CH3F, CH4, Ar, O2, H2, and N2. Partial etching of via 214 is performed so that the bottom of via terminates between the top and bottom surfaces 116, 118 of substrate 110 as shown in FIG. 13.

After the partial H2 vias 214 are formed in substrate 110, photoresist layer 250 is removed by any suitable wet or dry stripping process leaving the substrate structure shown in FIG. 13 with hard mask 220 and L1 trench openings 222 still intact.

Figure 14:
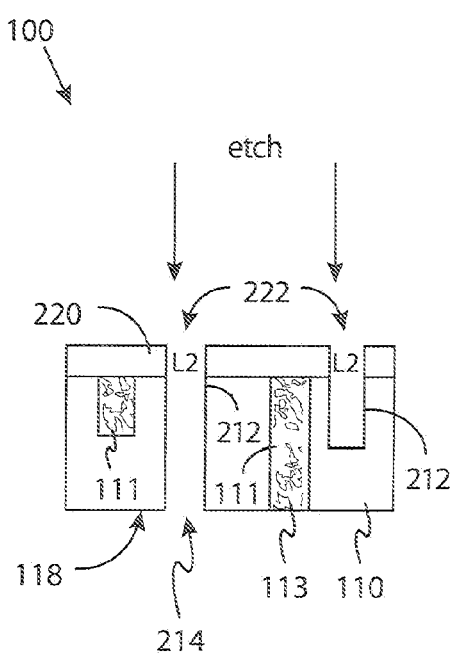

The method for forming semiconductor structure 100 continues by next fully forming the L2 trenches 212 and H2 vias 214 in substrate 110. Referring to FIG. 14, a sixth etching process such as a dual damascene gaseous etching process is used to form trenches 212 and vias 214. In some embodiments, the same gas chemistry used to partially form via 214 (see FIG. 13) may be used. Accordingly, suitable exemplary etching gases include without limitation CF4, CHF3, CH2F2, CH3F, CH4, Ar, O2, H2, and N2. It is desirable that the etching gas chemistry used selectively dissolves substrate 110 without substantially etching the hard mask 220. The etching process is performed until the L2 trenches 212 and associated H2 vias 214 are fully formed in substrate 110 as shown in FIG. 14. Via 214 completely penetrates substrate 110 and extends through the top and bottom surfaces 116, 118 of the substrate for forming a conductive interconnect with circuits dispose in the metal layer beneath substrate 110.

Figure 15:
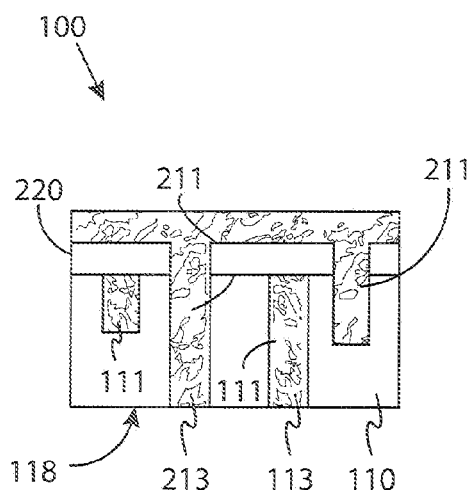

Referring now to FIG. 15, the method for forming semiconductor structure 100 continues with metallization of the heretofore open L2 trenches 212 and associated H2 via 214 structures in substrate 110. Any suitable conductive material such as without limitation conductive metals may be used for metallization. In some embodiments, copper is used and deposited in these open trench and via structures in the substrate by any suitable technique such as chemical vapor deposition (CVD), physical vapor deposition (PVD), electrochemical plating (ECP), electroless-plating, etc. In some embodiments, ECP is used. An overburden of copper is typically formed on top of substrate 110, producing the structure shown in FIG. 15. The conductive metal in the second trenches 212 and second vias 214 respectively form second conductive lines 211 forming part of a circuit within substrate 110 and second conductive via interconnects 213 for connecting the circuit within substrate 110 to a circuit formed in a substrate immediately below (not shown).

In some embodiments, at least some of second conductive lines 211 are interspersed between first conductive lines 111 as shown in FIG. 15 (e.g. see line 211 disposed above via interconnect 213 between conductive lines 111 to the right and left).

Figure 16:
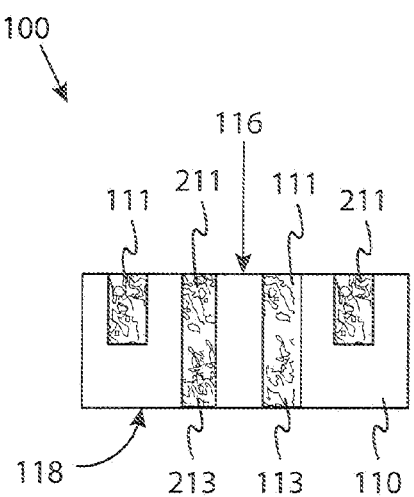

In FIG. 16, the method for forming semiconductor structure 100 continues and is completed with removing the second hard mask 220 and overburden of copper thereon. In some embodiments, a second planarization process such as chemical mechanical planarization (CMP) is used to remove the hard mask and overburden. This produces the completed semiconductor structure 100 shown in FIG. 16 in which the top surface 116 of substrate 110 is again planarized.

Advantages provided by embodiments according to the present disclosure for forming a semiconductor structure 100 include larger via-to-metal landing area for the slot- or box-shaped vias and self-aligned via processes, and relaxation of overlay and via local uniformity requirements. These benefits are produced by forming some of the conductive lines (e.g. conductive lines 111, FIG. 7) first followed by forming the remaining conductive lines (e.g. conductive lines 211, FIG. 15). This permits use of the elongated via holes 152/252 in photoresist layers 150/252 to compensate for misalignment or aberration in the photolithography processes and equipment used to form holes 152/252 that may be attributed to lens limitations and depth of focus, inaccuracies in the stepping equipment for reproducing images on the photoresist, photomask misalignment, and other variables. Such variations are magnified and more acute with dual damascene processes used in N20 and below technology nodes.

Figure 18:
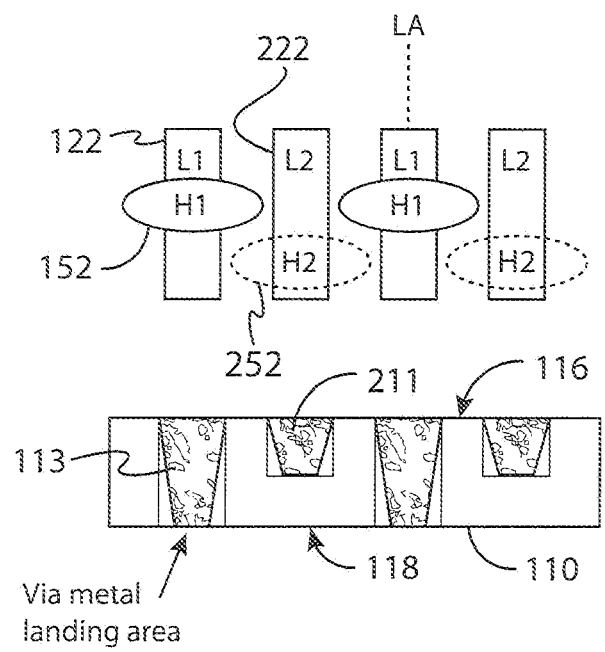
FIG. 18 is a schematic diagram showing a top plan view of another exemplary arrangement of trench etching holes formed in a hard mask(s) and via etching holes formed in a photoresist layer(s) overlying the trench etching holes, with an exemplary cross-section of a semiconductor structure having conductive lines and via interconnects shown immediately below.

FIGS. 17 and 18 graphically illustrate the foregoing benefits of the semiconductor structure 100 fabrication and dual damascene processes according to the present disclosure. In FIG. 17, the elongated ellipsoidal H1 via holes 152 in photoresist layer 150 are ideally aligned with the rectilinear L1 trench openings 122 in hard mask 120. The overlap distance OL by which H1 via holes 152 extend beyond the lateral sides of trench openings 122 are approximately equal on each side. Fully formed conductive vias 113 are formed below conductive lines 111 (it will be appreciated that such conductive vias 113 may generally have a slightly tapered cross-sectional shape as shown due to limitations with current etching technology and the extremely small size vias being produced for interconnects in the N20 and below technologies).

In FIG. 18, photolithography equipment and/or process alignment problems has resulted in the H1 via holes 152 being laterally offset with respect to the longitudinal axis LA of the trench openings 122 in hard mask 120. In this case, the via holes 152 are shifted to the right in FIG. 18. As can be seen, this shift does not adversely affect the etching of a compliant via in substrate 110 which will subsequently be metalized to produce a filled conductive via.

It will further be appreciated in FIGS. 17 and 18 that the L1 and L2 trench openings 122/222 do not exist simultaneously in time during the present semiconductor fabrication process, but are rather shown together to better illustrate the respective positions of each. By using a staggered production process for the trench openings as already described herein, this allows both ellipsoidal H1 and H2 via holes 152/252 to be used having a maximum transverse diameter D1 possible to provide the greatest degree of lateral misalignment tolerances to be used, thereby relaxing overlay requirements and constraints. If trench openings 122 and 222 were to be formed and existed simultaneously as actually shown in FIGS. 17 and 18, it can be appreciated that the maximum transverse diameter D1 of via holes 152/252 that could be used would be greatly restricted by the proximity of the L1 and L2 trench openings. In various embodiments, therefore, the transverse diameter D1 of the H1/H2 via holes 152/252 may be at least larger than the width W of the trench openings 122/222, and in some embodiments larger than twice the width W of the trench openings 122/222.

According to one exemplary embodiment of the present disclosure, a method for forming a semiconductor structure includes: forming a first patterned hard mask on a semiconductor substrate; etching the substrate using the first hard mask to form a plurality of first trenches and first vias associated with the first trenches in the substrate; depositing conductive metal in the first trenches and first vias for forming first conductive lines and first conductive via interconnects respectively; removing the first hard mask; forming a second patterned hard mask on the semiconductor substrate; etching the substrate using the second hard mask to form a plurality of second trenches and second vias associated with the second trenches in the substrate; and depositing a conductive metal in the second trenches and second vias for forming second conductive lines and second conductive via interconnects respectively. In some embodiments, at least some of the first conductive lines are interspersed between some of the second conductive lines. The method further includes performing a first planarization process before forming the second patterned hard mask, wherein the first planarization process removes the first hard mask and exposes a top surface of the substrate before forming the second patterned hard mask.

According to another exemplary embodiment of the present disclosure, a method for forming a semiconductor structure includes: forming a first hard mask on a semiconductor substrate; patterning the first hard mask to form a plurality of first trench openings therein; forming a first patterned photoresist layer including a plurality of first via holes on the first hard mask; etching the substrate to form a plurality of first trenches and first vias associated with the first trenches in the substrate; depositing conductive metal in the first trenches and first vias; removing the first hard mask; forming a second hard mask on the semiconductor substrate; patterning the second hard mask to form a plurality of second trench openings therein; forming a second patterned photoresist layer including a plurality of second via holes on the second hard mask; etching the substrate to form a plurality of second trenches and second vias associated with the second trenches in the substrate; and depositing conductive metal in the second trenches and second vias. In some embodiments, at least some of the first trenches are interspersed between some of the second trenches in the substrate.

According to another exemplary embodiment of the present disclosure, a method for forming a semiconductor structure includes: forming a first hard mask on a semiconductor substrate; patterning the first hard mask to form a plurality of first trench openings therein; forming a first patterned photoresist layer including a plurality of first via holes on the first hard mask; etching the substrate to form a plurality of first trenches and first vias associated with the first trenches in the substrate; depositing conductive metal in the first trenches and first vias for forming first conductive lines and first conductive via interconnects respectively; removing the first hard mask by a planarization process to expose a top surface of the substrate; forming a second hard mask on the semiconductor substrate; patterning the second hard mask to form a plurality of second trench openings therein; forming a second patterned photoresist layer including a plurality of second via holes on the second hard mask; etching the substrate to form a plurality of second trenches and second vias associated with the second trenches in the substrate; depositing conductive metal in the second trenches and second vias for forming second conductive lines and second conductive via interconnects respectively; and removing the second hard mask by a planarization process to expose the top surface of the substrate. In some embodiments, at least some of the first conductive lines are interspersed between some of the second conductive lines.

While the foregoing description and drawings represent exemplary embodiments of the present disclosure, it will be understood that various additions, modifications and substitutions may be made therein without departing from the spirit, scope, and range of equivalents of the accompanying claims. In particular, it will be clear to those skilled in the art that such embodiments may be embodied in other forms, structures, arrangements, proportions, sizes, and with other elements, materials, and components, without departing from the spirit or essential characteristics thereof. In addition, numerous variations in the methods/processes described herein may be made without departing from the spirit of the present disclosure.

What is claimed is:

1. A method for forming a semiconductor structure comprising:

forming a first patterned hard mask on a semiconductor substrate;

etching the substrate using the first hard mask to form a plurality of first trenches and first vias associated with the first trenches in the substrate;

depositing conductive metal in the first trenches and first vias for forming first conductive lines and first conductive via interconnects respectively;

removing the first hard mask;

forming a second patterned hard mask on the semiconductor substrate;

etching the substrate using the second hard mask to form a plurality of second trenches and second vias associated with the second trenches in the substrate; and depositing a conductive metal in the second trenches and second vias for forming second conductive lines and second conductive via interconnects respectively.

2. The method of claim 1, wherein at least some of the first conductive lines are interspersed between some of the second conductive lines.

3. The method of claim 1, further comprising performing a first planarization process before forming the second patterned hard mask, the first planarization process removing the first hard mask.

4. The method of claim 3, further comprising performing a second planarization process after forming the second conductive lines and second conductive via interconnects.

5. The method of claim 1, wherein the first patterned hard mask includes a plurality of first trench openings for etching the substrate.

6. The method of claim 1, further comprising:
forming a first photoresist layer having a plurality of elongated first via holes on the first hard mask;
etching the substrate using the first photoresist layer; and
partially forming the first vias in the substrate before the step of etching the substrate using the first hard mask to form a plurality of first trenches and first vias associated with the first trenches in the substrate.

7. The method of claim 6, wherein the first via holes have an ellipsoidal shape.

8. The method of claim 6, wherein the first via holes each are located over one of a plurality of first trench openings in the first hard mask, the first vias being partially formed in the substrate by etching through the first trench openings and first via holes.

9. The method of claim 8, wherein the first via holes have an ellipsoidal shape with a transverse diameter that is larger than a width of the first trench openings.

10. The method of claim 6, further comprising:
forming a second photoresist layer having a plurality of elongated second via holes on the second hard mask;
etching the substrate using the second photoresist layer; and
partially forming the second vias in the substrate before the step of etching the substrate using the second hard mask to form a plurality of second trenches and second vias associated with the second trenches in the substrate.

11. The method of claim 1, wherein the second patterned hard mask covers the first conductive lines for protection against etching.

12. The method of claim 1, wherein the first or second hard mask is made of a material selected from the group consisting of Ti (titanium), TiN (titanium nitride), Ta (tantium), and TaN (tantium nitride).

13. The method of claim 1, wherein the first patterned hard mask includes a plurality of first trench openings and the second patterned hard mask includes a plurality of second trench openings different than the first trench openings.

14. A method for forming a semiconductor structure comprising:
forming a first hard mask on a semiconductor substrate;
patterning the first hard mask to form a plurality of first trench openings therein;
forming a first patterned photoresist layer including a plurality of first via holes on the first hard mask;
etching the substrate to form a plurality of first trenches and first vias associated with the first trenches in the substrate;
depositing conductive metal in the first trenches and first vias;
removing the first hard mask;
forming a second hard mask on the semiconductor substrate;
patterning the second hard mask to form a plurality of second trench openings therein;
forming a second patterned photoresist layer including a plurality of second via holes on the second hard mask;
etching the substrate to form a plurality of second trenches and second vias associated with the second trenches in the substrate; and
depositing conductive metal in the second trenches and second vias.

15. The method of claim 14, wherein at least some of the first trenches are interspersed between some of the second trenches in the substrate.

16. The method of claim 14, further comprising:
partially etching the first vias in the substrate using the first photoresist layer before the step of etching the substrate to form a plurality of first trenches and first vias associated with the first trenches in the substrate.

17. The method of claim 16, further comprising removing the first photoresist layer after partially etching the first vias, wherein the first trenches and first vias are fully formed in the substrate during the step of etching the substrate to form a plurality of first trenches and first vias associated with the first trenches in the substrate.

18. A method for forming a semiconductor structure comprising:
forming a first hard mask on a semiconductor substrate;
patterning the first hard mask to form a plurality of first trench openings therein;
forming a first patterned photoresist layer including a plurality of first via holes on the first hard mask;
etching the substrate to form a plurality of first trenches and first vias associated with the first trenches in the substrate;
depositing conductive metal in the first trenches and first vias for forming first conductive lines and first conductive via interconnects respectively;
removing the first hard mask by a planarization process to expose a top surface of the substrate;
forming a second hard mask on the semiconductor substrate;
patterning the second hard mask to form a plurality of second trench openings therein;
forming a second patterned photoresist layer including a plurality of second via holes on the second hard mask;
etching the substrate to form a plurality of second trenches and second vias associated with the second trenches in the substrate;
depositing conductive metal in the second trenches and second vias for forming second conductive lines and second conductive via interconnects respectively; and
removing the second hard mask by a planarization process to expose the top surface of the substrate.

19. The method of claim 18, wherein at least some of the first conductive lines are interspersed between some of the second conductive lines.

20. The method of claim 18, wherein the planarization process used is chemical mechanical planarization.

\* \* \* \* \*

UNITED STATES PATENT AND TRADEMARK OFFICE
CERTIFICATE OF CORRECTION

Page 1 of 1

PATENT NO. : 8,633,108 B1
APPLICATION NO. : 13/665165
DATED : January 21, 2014
INVENTOR(S) : Chia-Ying Lee and Jyu-Horng Shieh It is certified that error appears in the above-identified patent and that said Letters Patent is hereby corrected as shown below:

In the Specification
Column 2, line 62, replace "tantium" with --tantalum--
Column 2, line 63, replace "tantium" with --tantalum--

In the Claims
Column 11, line 62, replace "tantium" with --tantalum--
Column 11, line 63, replace "tantium" with --tantalum--

Signed and Sealed this
Ninth Day of September, 2014

Michelle K. Lee
*Deputy Director of the United States Patent and Trademark Office*